US012559371B2

(12) United States Patent (10) Patent No.: US 12,559,371 B2
Agrawal et al. (45) Date of Patent: Feb. 24, 2026

(54) DIRECT SOLUTION DEPOSITION OF METAL SELENIDE SEMICONDUCTORS USING NOVEL METAL-SELENIUM COMPLEXES AND FILMS MADE THEREFROM

(71) Applicant: Purdue Research Foundation, West Lafayette, IN (US)

(72) Inventors: Rakesh Agrawal, West Lafayette, IN (US); Jonathan William Turnley, Lafayette, IN (US); Swapnil Deshmukh, Tualatin, OR (US)

(73) Assignee: Purdue Research Foundation, West Lafayette, IN (US)

( * ) Notice: Subject to any disclaimer, the term of this patent is extended or adjusted under 35 U.S.C. 154(b) by 453 days.

(21) Appl. No.: 18/191,917

(22) Filed: Mar. 29, 2023

(65) Prior Publication Data

US 2024/0327218 A1 Oct. 3, 2024

(51) Int. Cl.
*C01B 19/02* (2006.01)
*H10F 71/00* (2025.01)
*H10F 77/12* (2025.01)

(52) U.S. Cl.
CPC ............. *C01B 19/02* (2013.01); *H10F 71/00* (2025.01); *H10F 77/12* (2025.01); *C01P*

*2002/72* (2013.01); *C01P 2002/82* (2013.01); *C01P 2002/86* (2013.01); *C01P 2006/40* (2013.01)

(58) Field of Classification Search
CPC ......... C01B 19/02; H10F 71/00; H10F 77/12; H10F 77/126; C01P 2002/72; C01P 2002/82; C01P 2002/86; C01P 2006/40; H01L 31/18; H01L 31/032; H01L 31/0322

See application file for complete search history.

(56) References Cited

U.S. PATENT DOCUMENTS 11,897,766 B2 * 2/2024 Haben ...................... B22F 9/24

* cited by examiner

*Primary Examiner* — Earl N Taylor
(74) *Attorney, Agent, or Firm* — David E. Novak; Brannon Sowers & Cracraft PC

(57) ABSTRACT

A method of direct deposition of multinary metal polyselenide films, including precipitating alkylammonium polyselenide with an antisolvent, redissolution of precipitated alkylammonium polyselenide with a solvent, dissolving at least one metal source, such as elemental metal, a metal containing compound, or a combination thereof, in the solution containing polyselenide ions to provide a precursor solution, and using the precursor solution to fabricate metal polyselenides. The metal source is selected from the group consisting of Ag, Cu, Zn, Cd, In, Ga, Sn, Ge, As, Cu$_2$Se, Cu$_2$O, CuCl, and combinations thereof. The precursor solution is substantially sulfur-free.

19 Claims, 20 Drawing Sheets

40 nm

DIRECT SOLUTION DEPOSITION OF METAL SELENIDE SEMICONDUCTORS USING NOVEL METAL-SELENIUM COMPLEXES AND FILMS MADE THEREFROM

STATEMENT REGARDING GOVERNMENT FUNDING

This invention was made with government support under grants 1735282-DGE and 1855882-CBET awarded by the National Science Foundation. The government has certain rights in the invention.

BACKGROUND

This section introduces aspects that may help facilitate a better understanding of the disclosure. Accordingly, these statements are to be read in this light and are not to be understood as admissions about what may or may not be prior art.

Chalcogenide semiconductors are a versatile class of materials with a wide range of applications, including photovoltaics, thermoelectrics, light emitting diodes, and transistors, and the like. Solution-based deposition methods for these materials offer great promise in reducing costs, increasing throughput, and improving materials usage efficiency as compared to vacuum deposition methods. Direct dissolution of the desired metal chalcogenides in a simple solvent is often impossible, leading to the use of soluble metal halides, nitrates, and acetylacetonates as precursors. However, use of these metal salts can lead to challenges with anionic impurities. Therefore, there has been considerable effort to develop reactive dissolution systems that can convert high purity metal or metal chalcogenide precursors and react to form soluble metal-chalcogen bonded complexes.

Combinations of amines and thiols have been shown to serve as a powerful reactive solvent system capable of dissolving a range of metals, chalcogenides, metal chalcogenides, and metal salts. In solution, it has been shown that these amine-thiol solutions lead to the formation of soluble alkylammonium metal thiolates. Given the direct metal-sulfur bonding in these species, they provide a convenient route to synthesize metal sulfides. However, in the pursuit of metal selenides, the thiol can still act as a sulfur source, leading to the synthesis of a sulfoselenide material. Therefore, in order to obtain solution-processed, sulfur-free metal selenide semiconductors a new selenium-based reactive solvent system is needed. The present novel technology addresses this need.

DETAILED DESCRIPTION OF THE INVENTION

Figure 1:
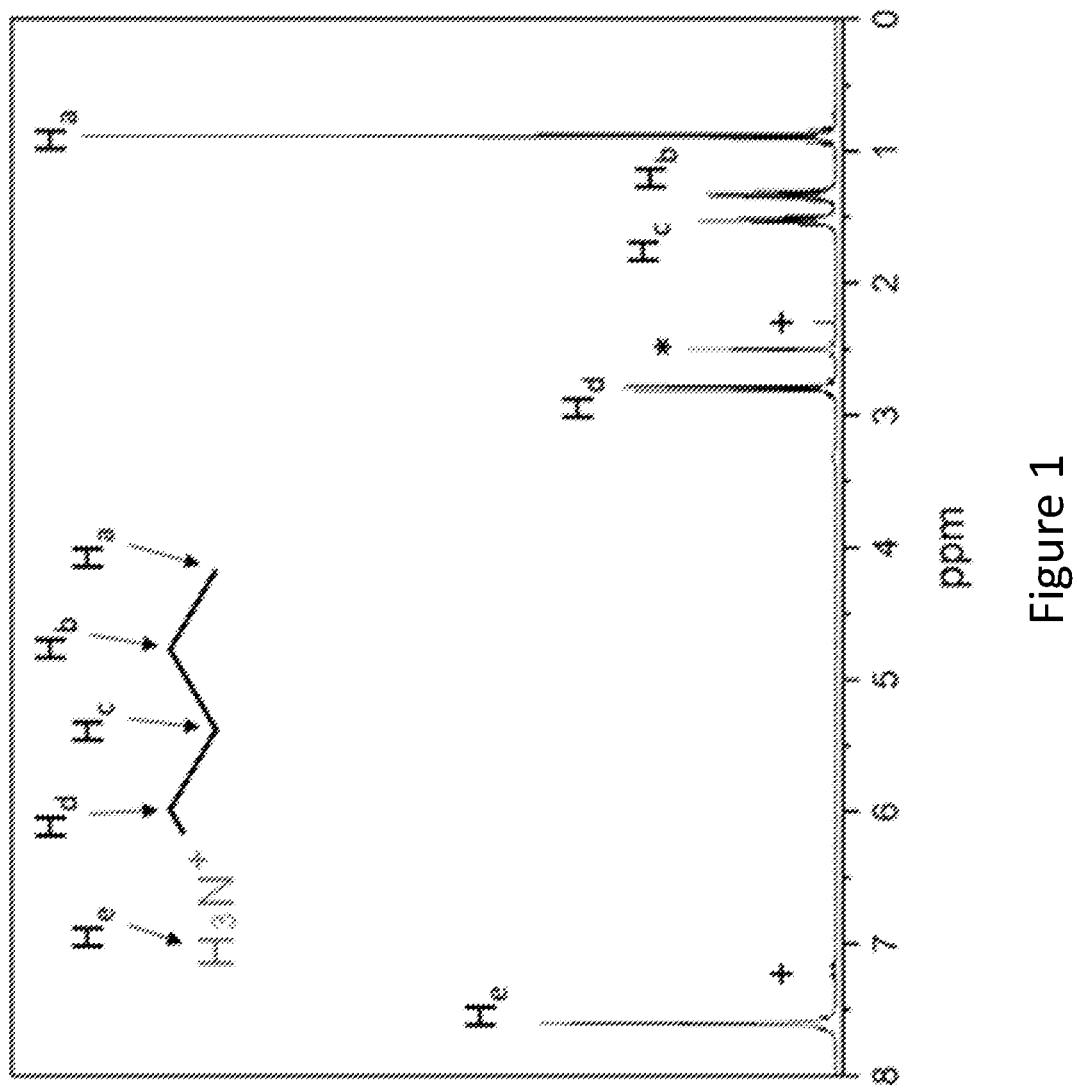
FIG. 1 shows a proton nuclear magnetic resonance spectrum for redissolved butylammonium polyselenide (BAPSe) dissolved in deuterated dimethyl sulfoxide. The spectrum shows the presence of peaks related to butylammonium. The peaks marked with a + are attributed to residual toluene and the peaks marked with a * are from the deuterated dimethyl sulfoxide.

For the purposes of promoting an understanding of the principles of the claimed technology and presenting its currently understood best mode of operation, reference will now be made to the embodiments illustrated in the drawings and specific language will be used to describe the same. It will nevertheless be understood that no limitation of the scope of the invention is thereby intended, with such alterations and further modifications in the illustrated device and such further applications of the principles of the claimed technology as illustrated therein being contemplated as would normally occur to one skilled in the art to which the claimed technology relates.

Described here is a direct method for dissolving metals and metal compounds utilizing solutions containing polyselenide ions. The method of dissolution can be used as a means to remove undesired species and/or for the preparation of solution-phase precursors for the fabrication of binary and multinary metal selenides.

In one aspect of this disclosure, a method of dissolving at least one metal in a solution containing polyselenide ions is presented. In another aspect of this disclosure, a method of dissolving at least one metal compound, including metal oxide, metal chalcogenide, and/or metal salt, in a solution containing polyselenide ions is presented. In another aspect of this disclosure, a method for using a solution containing at least one dissolved metal or metal compound for the synthesis of binary or multinary metal selenide materials is dissolved.

Presented in this disclosure is a method for dissolving metals and metal compounds in solutions containing polyselenide ions. This method can be particularly useful in creating dissolved precursors for the fabrication of metal selenides. This method can also be useful in situations where an undesired compound is removed via dissolution in a polyselenide ion containing solution.

The first step in this method is to obtain a solution containing polyselenide ions. While this can be accomplished in numerous ways, one route is through the isolation and redissolution of alkylammonium polyselenides. It has been previously identified that when selenium is dissolved in a monoamine-monothiol, a monoamine-dithiol, or like solution it will produce an alkylammonium polyselenide species and a disulfide species. However, to create a solution that is free of sulfur, the alkylammonium polyselenide species is separated from the sulfur containing species in the solution. This separation can be achieved by at least one of the two methods. When sulfur containing species are more volatile than the alkylammonium polyselenide, they can be evaporated and the left over alkylammonium polyselenide residue can be redissolved in another suitable solvent to provide an alkylammonium polyselenide solution for further use according to the current invention. In another method, the alkylammonium polyselenide from the amine-thiol solution can be precipitated with an antisolvent, separated and redissolved in an appropriate solvent to provide the alkylammonium polyselenide solution. The antisolvent is generally non-polar, such as toluene or cyclohexane. The solvent for redissolution is generally polar and could be a single solvent or a mixture of one or more solvents. The list of polar solvents includes an amine, diamine, N-methylformamide, dimethylformamide, dimethylsulfoxide, acetonitrile, an alcohol, pyridine etc. It should be noted that this is not an exhaustive list of solvents and only gives example of some of the preferred solvents.

For the purpose of this invention, monoamine can be any suitable monoamine such as $R_1NH_2$, whereby $R_1$ and $R_2$ represent any alkane, alkene, alkyne, functional group/s, and/or hydrogen that connect to the nitrogen of the amine. The preferred $R_1$ or the $R_2$ group contains one or more hydrogen atoms and $C_n$ carbon atoms with n ranging from 2 to 24. Similarly, a monothiol is represented by $R_4SH$, whereby $R_4$ represent any alkane, alkene, alkyne, functional group/s connected to the sulfur atom. It should be noted that in these chemical formulas, R includes linear or cyclic compounds or joined compounds such as single R group could represent multiple R groups. Some preferred examples of monoamines are $C_nH_{2n+1}NH_2$ with n=2 to 16 and thereby includes propylamine, butylamine, hexylamine, cyclohexylamine, octylamine, and oleylamine. Similarly, some preferred examples of monothiols include $C_nH_{2n+1}SH$ with n=2 to 12 and thereby includes ethane thiol, propane thiol, butanethiol, hexanethiol, and dodecanethiol.

FIG. 1 shows a proton nuclear magnetic resonance spectrum for redissolved butylammonium polyselenide (BAPSe) solution that was created by dissolving selenium in a solution of butylamine (BA) and ethanethiol (ET). The butylammonium polyselenide was then precipitated by adding a mixture of toluene and cyclohexane to the Se containing BA-ET solution. The BAPSe precipitate was isolated by separating the liquid and redissolved in deuterated dimethyl sulfoxide. The spectrum shows the presence of peaks related to butylammonium, and also reveals the absence of any sulfur containing thiols or disulfides.

Figure 2:
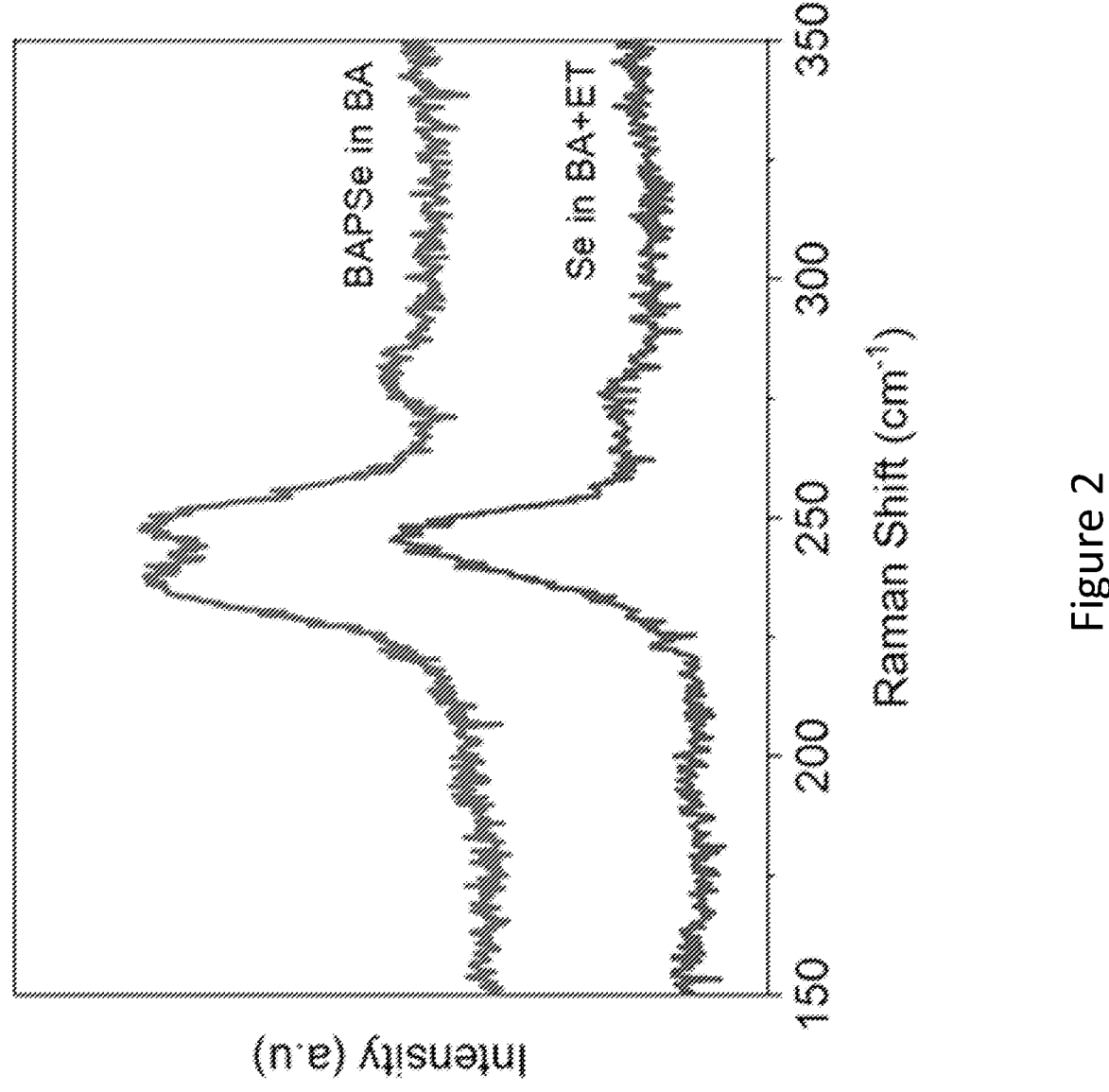
FIG. 2 shows a Raman spectrum for butylammonium polyselenide dissolved in butylamine (top). This is compared to selenium dissolved in a solution of butylamine and ethanethiol (bottom).

FIG. 2 shows a Raman spectrum for butylammonium polyselenide prepared in the same way but redissolved in butylamine. This is compared to selenium dissolved in a solution of butylamine and ethanethiol. In the case of selenium dissolved in the amine-thiol solution, the presence of the polyselenide ions is evidenced by the peak at approximately 245 cm$^{-1}$ that corresponds to selenium-selenium bonds. For the butylammonium polyselenide, polyselenide ions are evidenced by peaks at 237 cm$^{-1}$ and at 249 cm$^{-1}$. The position of a selenium-selenium peak changes both with the number of Se atoms in the polyselenide species and the structure of the polyselenide ions, be it in a chain or a ring. For polyselenide chains, a larger Raman shift would correspond to a shorter chain length. The Raman shift for cyclic polyselenide ions does not vary linearly with size but the Se$_6$ and the Se$_8$ rings are expected to have a peaks at 247 cm$^{-1}$ and 249 cm$^{-1}$, respectively. However, it is thought that in solution there is a tendency for polyselenide ions to exist in chain form. While from this discussion it is apparent that the solution may contain multiple polyselenide species containing different chain lengths of selenium and could be construed as containing polyselenides, we will refer such a solution as a polyselenide solution.

Alternative methods for synthesizing polyselenide solutions will exist. These could include the synthesis of other polyselenide species with alternative organic cations. Alternatively, polyselenide species with an inorganic cation can exist. One route is through the dissolution of selenium in hydrazine to make hydrazinium polyselenide. When selenium is dissolved in hydrazine to obtain a polyselenide solution, the resulting solution could directly be used without any precipitation and redissolution. Another example is through the dissolution of sodium polyselenide.

According to our invention, the solution containing polyselenides (or the polyselenide solution) can be contacted with the desired metal or metal compound to facilitate the dissolution. This includes contact with elemental metals, metal chalcogenides, metal oxides, metal salts, or combination thereof. While an array of metal and metal compounds can be dissolved in the polyselenide solutions, for the preparation of pure chalcogenides, the preferred choice is pure elemental metals and their chalcogenides. It should be noted that we have found the polyselenide solutions to be quite versatile in dissolving several metals, their chalcogenides and other compounds. The degree of solubility depends on the choice of polyselenide as well as metal under consideration, therefore, it is impossible to provide and exhaustive list of metals and metal compounds that could be dissolved using proposed polyselenide solutions and we provide only some examples. For the purpose of this specification, once a metal or a suitable metal compound has been dissolved in a polyselenide solution, the resulting solution is referred as either precursor solution or a precursor ink. For the example of butylammonium polyselenides dissolved in butylamine, possible metal precursors that can be dissolved include, but are not necessarily limited to, Ag, Cu, Zn, Cd, In, Ga, Sn, Ge, As, $Cu_2Se$, $Cu_2O$, CuCl, and combinations thereof. While elemental metals and their selenides are preferred precursors for dissolution in polyselenide solutions, it is also possible to dissolve metal oxides, metal halides, metal nitrates and sulfur-free organometallic compounds. Some examples of sulfur-free organometallic compounds include metal acetates and acetylacetonates such as copper (II) acetylacetonate, indium (III) acetylacetonate, zinc acetylacetonate hydrate powder, tin (IV)bis(acetylacetonate) dibromide etc.

Figure 3:
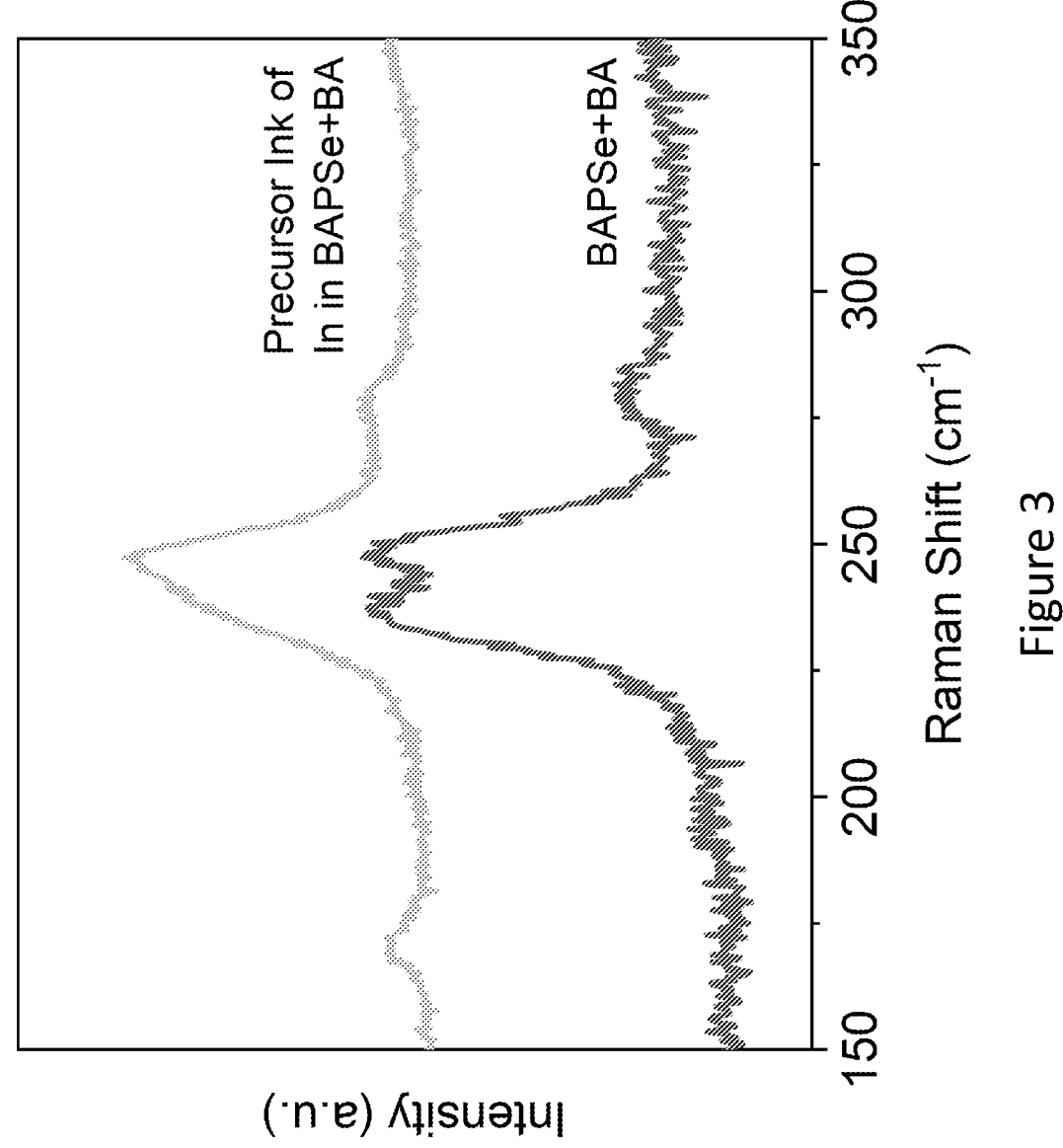
FIG. 3 shows a spectrum of Indium metal dissolved with a solution of butylammonium polyselenide in butylamine (top) compared to a solution containing only butylammonium polyselenide in butylamine (bottom).

FIG. 3 shows a Raman spectrum of Indium metal dissolved with a solution of butylammonium polyselenide in butylamine compared to a solution containing only butylammonium polyselenide in butylamine. The peak at 173 $cm^{-1}$ that can be attributed to In—Se bonding that forms when the metal is dissolved in the polyselenide containing solution. There are also a notable difference is the relative intensities of the Se—Se peaks. Following the reaction, the peak corresponding to longer chain lengths has decreased in magnitude relative to the peak corresponding to shorter chain lengths. This suggests that the oxidation of the metal provides electrons that breaks a larger polyselenide ions into two smaller polyselenide ions.

Figure 4:
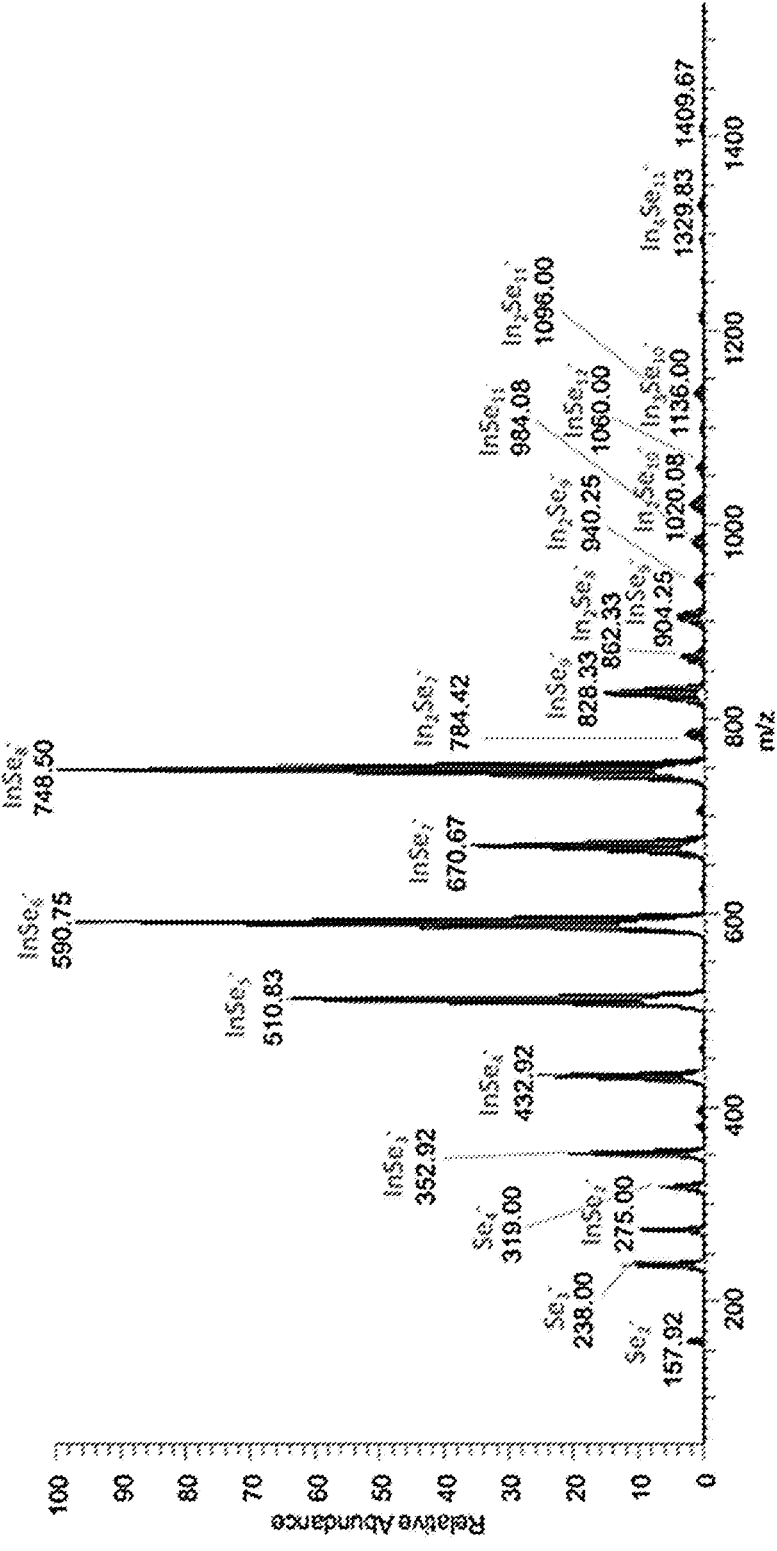
FIG. 4 shows a spectrum from Electrospray Ionization Mass Spectrometry operated in the negative mode from a sample of indium metal dissolved in a solution of butylammonium polyselenide in butylamine.

FIG. 4 shows a spectrum from Electrospray Ionization Mass Spectrometry operated in the negative mode from a sample of indium metal dissolved in a solution of butylammonium polyselenide in butylamine. This analysis reveals the presence of ions containing indium and selenium, as well as a few peaks for ions that only contain selenium. This suggests the formation of indium polyselenide anions in solution.

Figure 5:
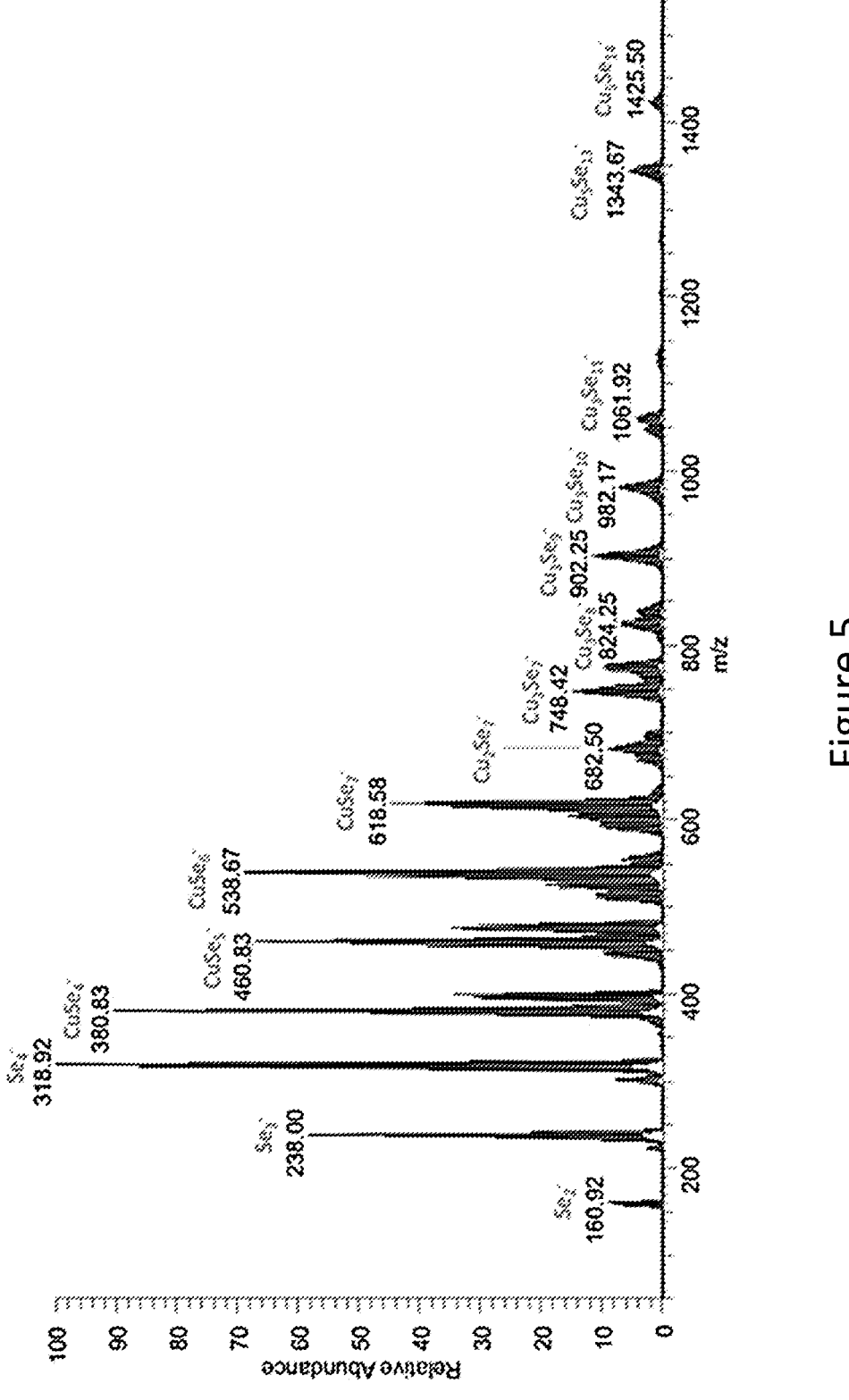
FIG. 5 shows a spectrum from Electrospray Ionization Mass Spectrometry operated in the negative mode from a sample of copper metal dissolved in a solution of butylammonium polyselenide in butylamine.

FIG. 5 shows a spectrum from Electrospray Ionization Mass Spectrometry operated in the negative mode from a sample of copper metal dissolved in a solution of butylammonium polyselenide in butylamine. Present in the spectrum are peaks for ions containing only copper and selenium, as well as ions containing only selenium. This suggests the formation of copper polyselenides anions in solution.

Figure 6:
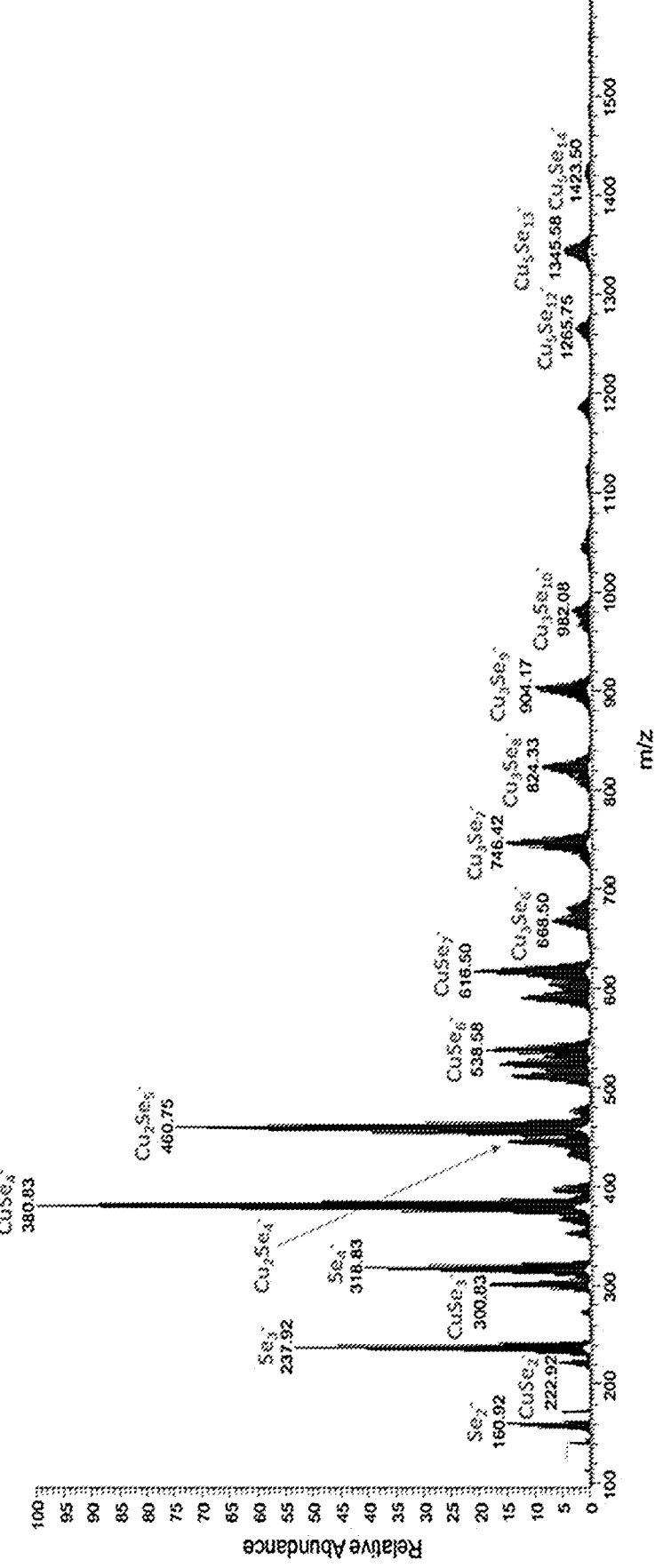
FIG. 6 shows a spectrum from Electrospray Ionization Mass Spectrometry operated in the negative mode from a sample of copper(I) selenide dissolved in a solution of butylammonium polyselenide in butylamine.
Figure 7:
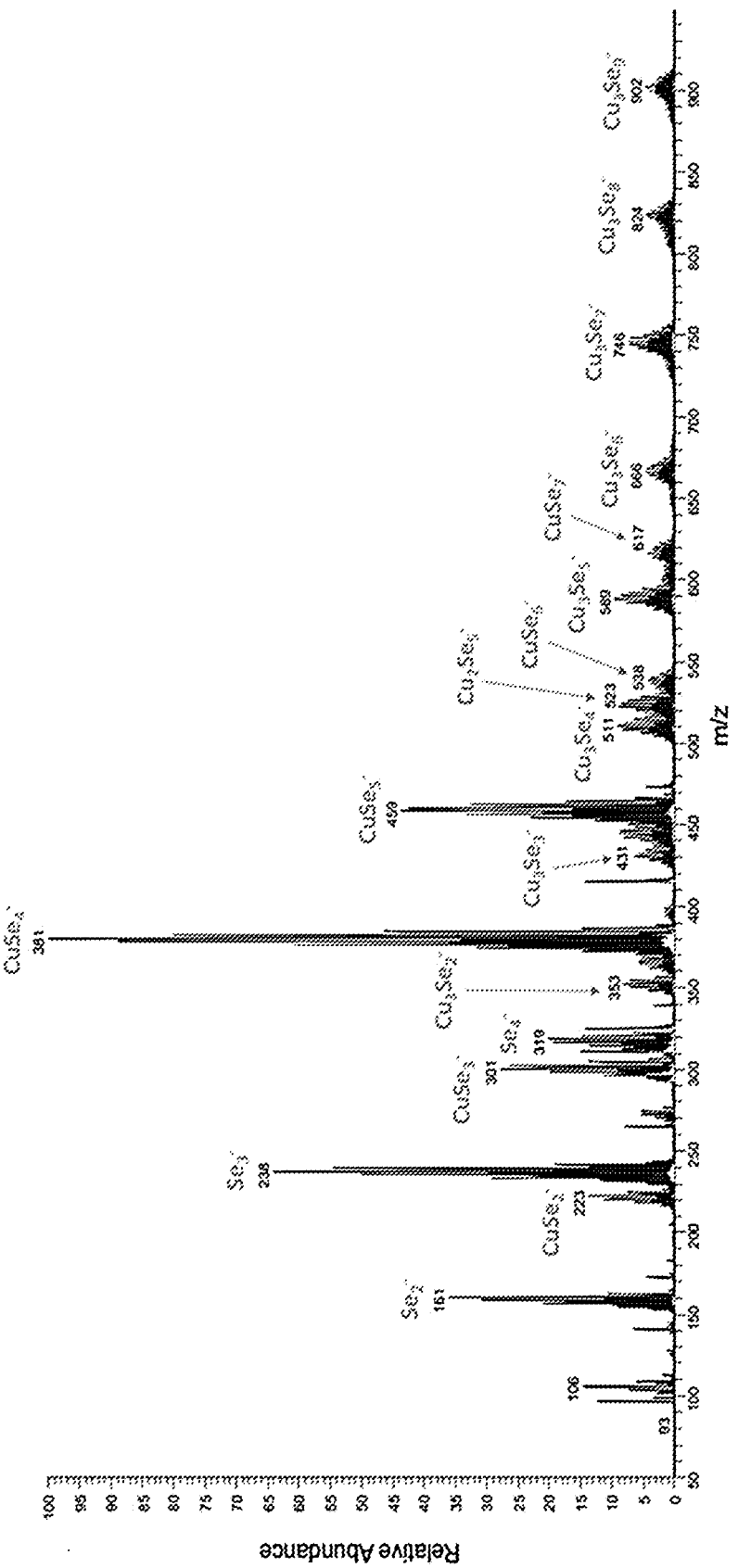
FIG. 7 shows a spectrum from Electrospray Ionization Mass Spectrometry operated in the negative mode from a sample of copper(I) oxide dissolved in a solution of butylammonium polyselenide in butylamine.
Figure 8:
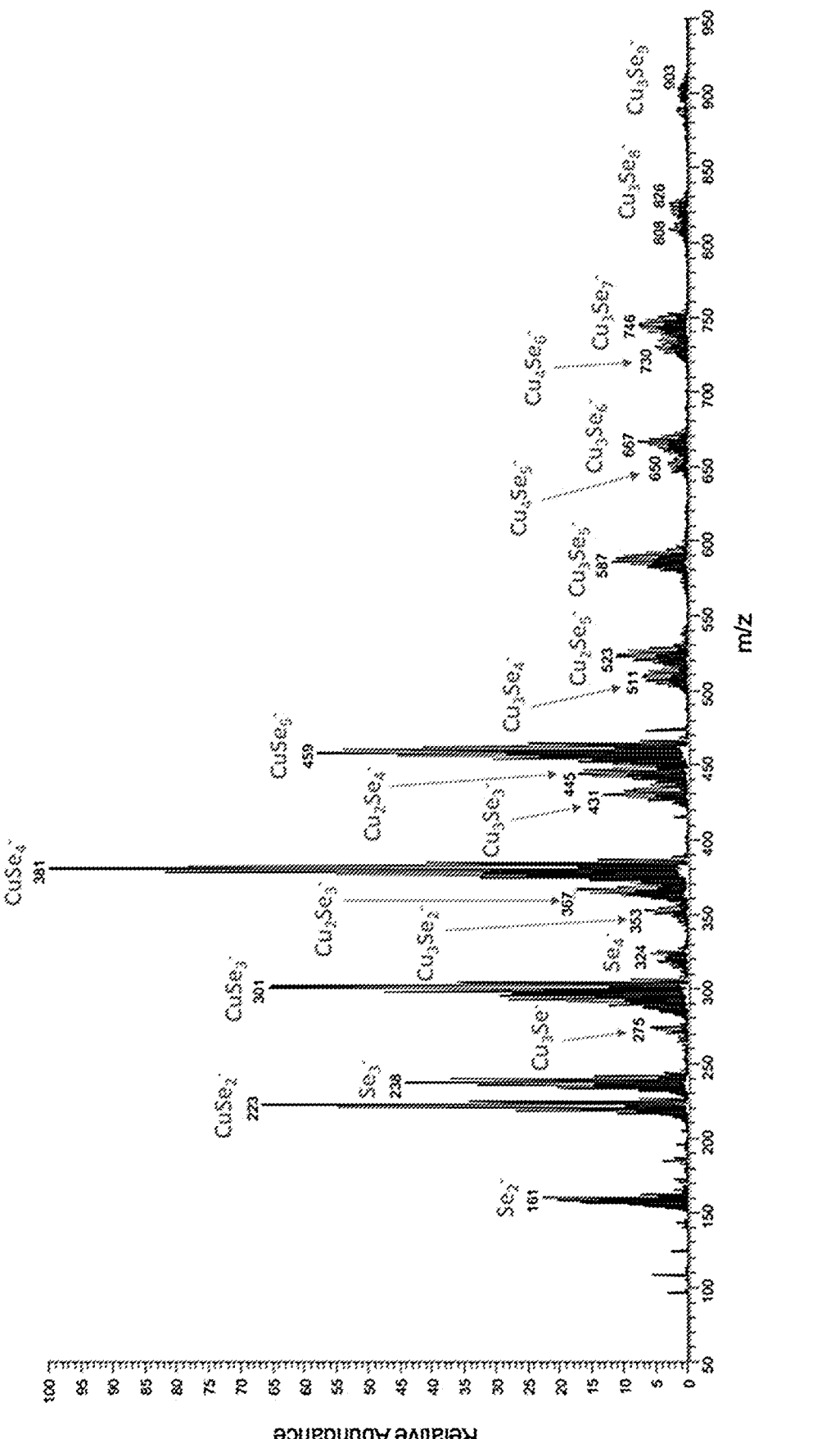
FIG. 8 shows a spectrum from Electrospray Ionization Mass Spectrometry operated in the negative mode from a sample of copper(I) chloride dissolved in a solution of butylammonium polyselenide in butylamine.
Figure 9:
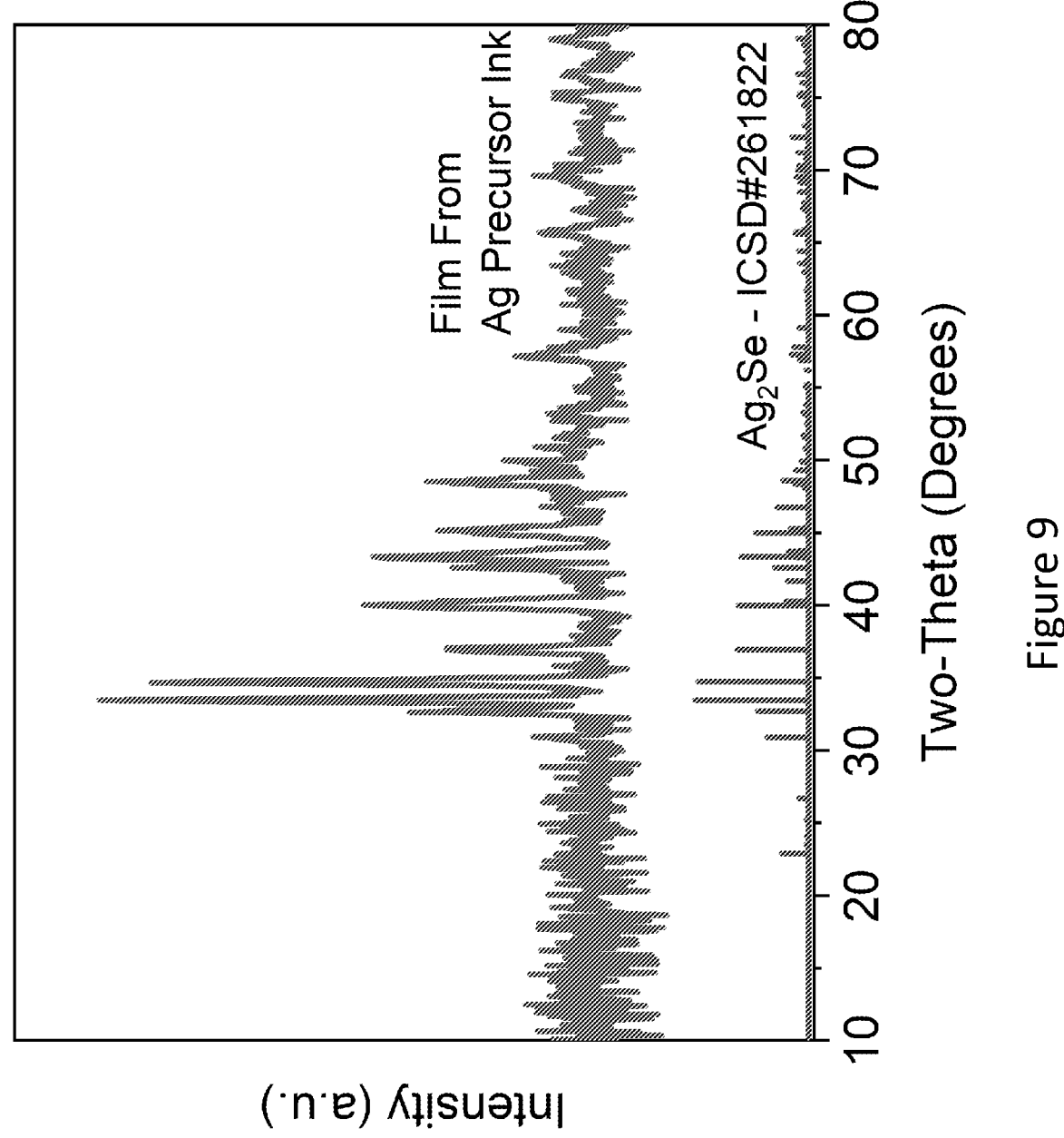
FIG. 9 shows the X-Ray Diffraction pattern for a $Ag_2Se$ film produced using an ink of silver dissolved in a solution of butylammonium polyselenide in butylamine.
Figure 10:
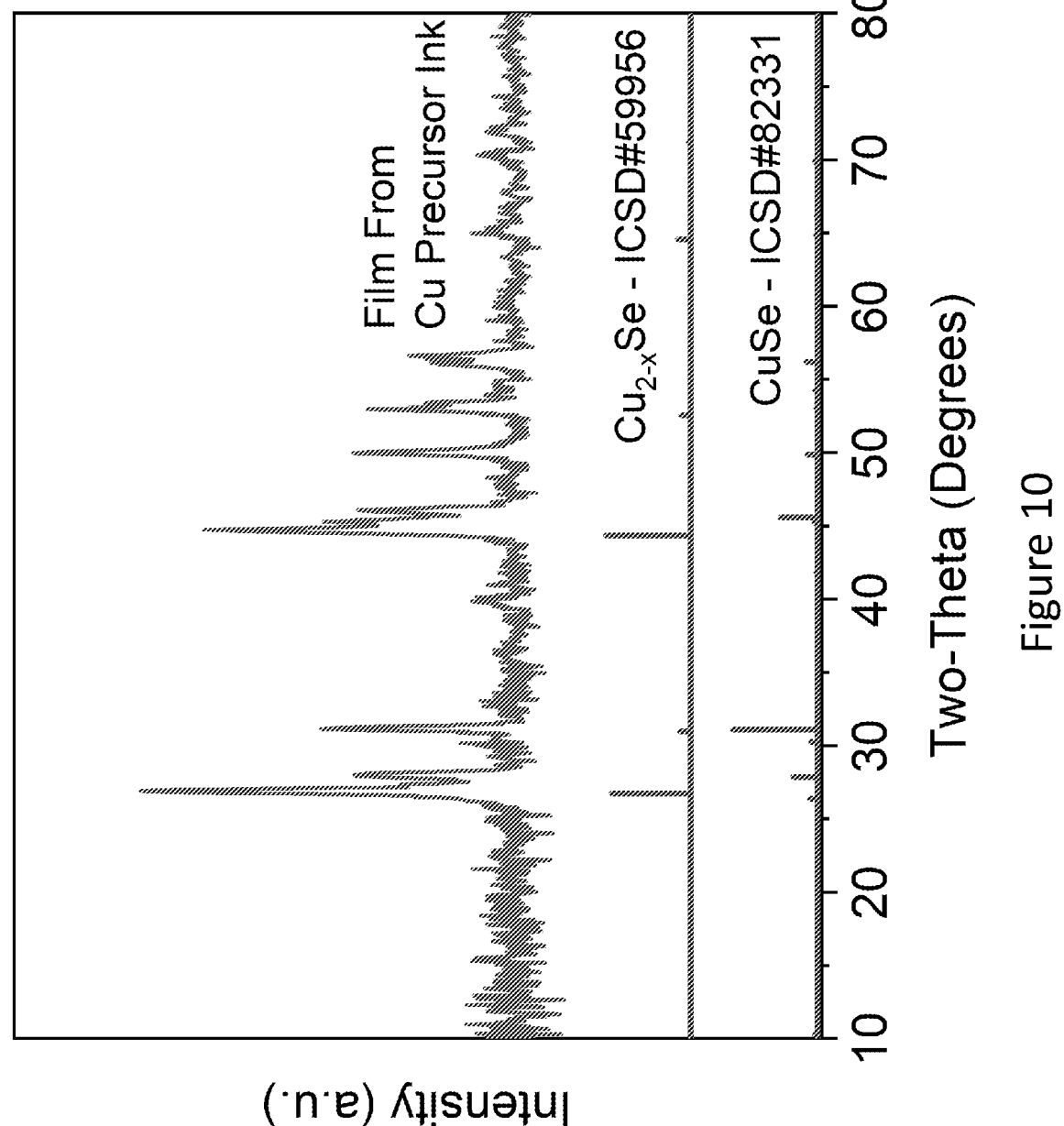
FIG. 10 shows the X-Ray Diffraction pattern for a film containing CuSe and $Cu_{2-x}Se$ that was produced using an ink of copper dissolved in a solution of butylammonium polyselenide in butylamine.
Figure 11:
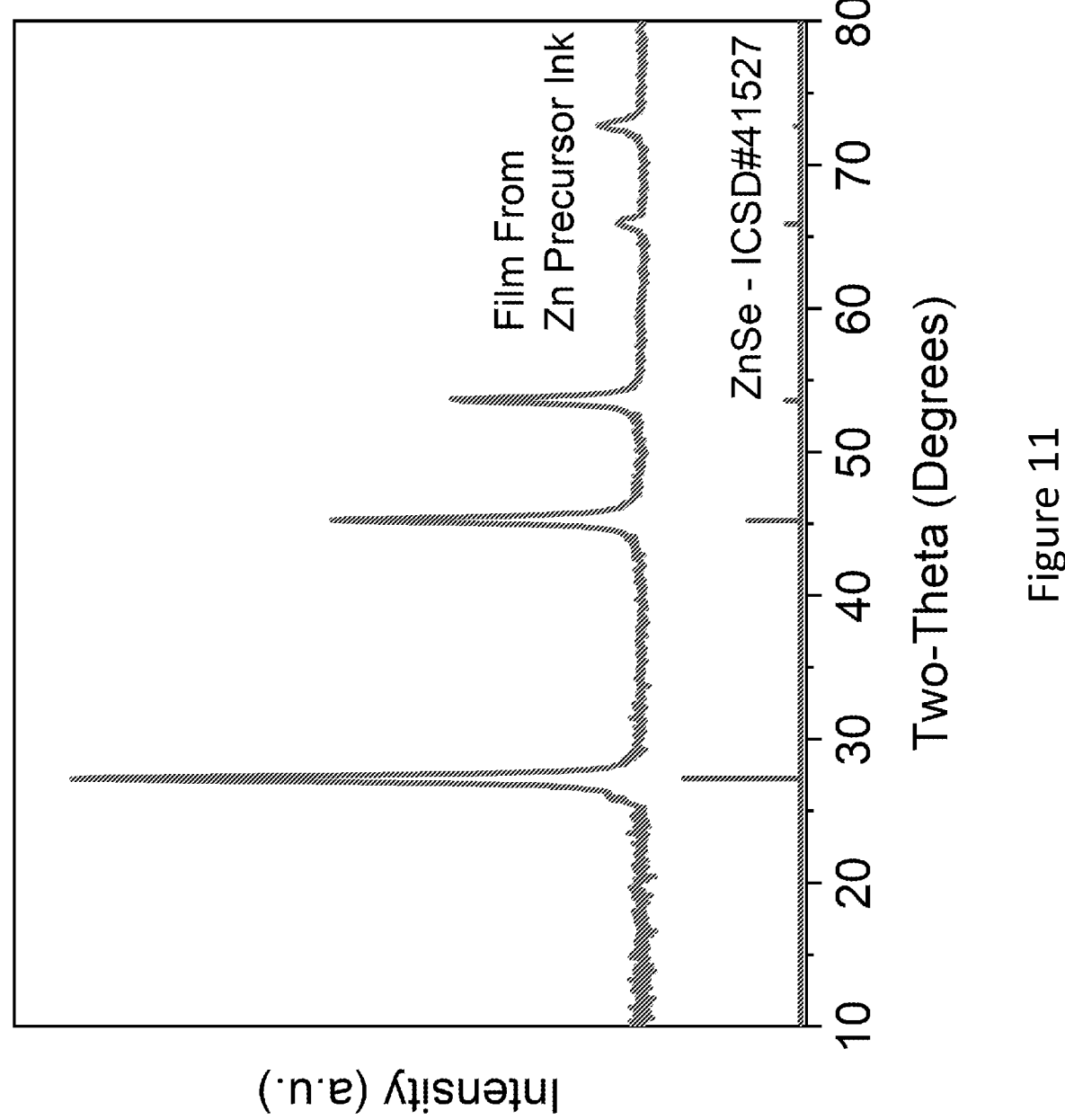
FIG. 11 shows the X-Ray Diffraction pattern for a ZnSe film produced using an ink of zinc dissolved in a solution of butylammonium polyselenide in butylamine.
Figure 12:
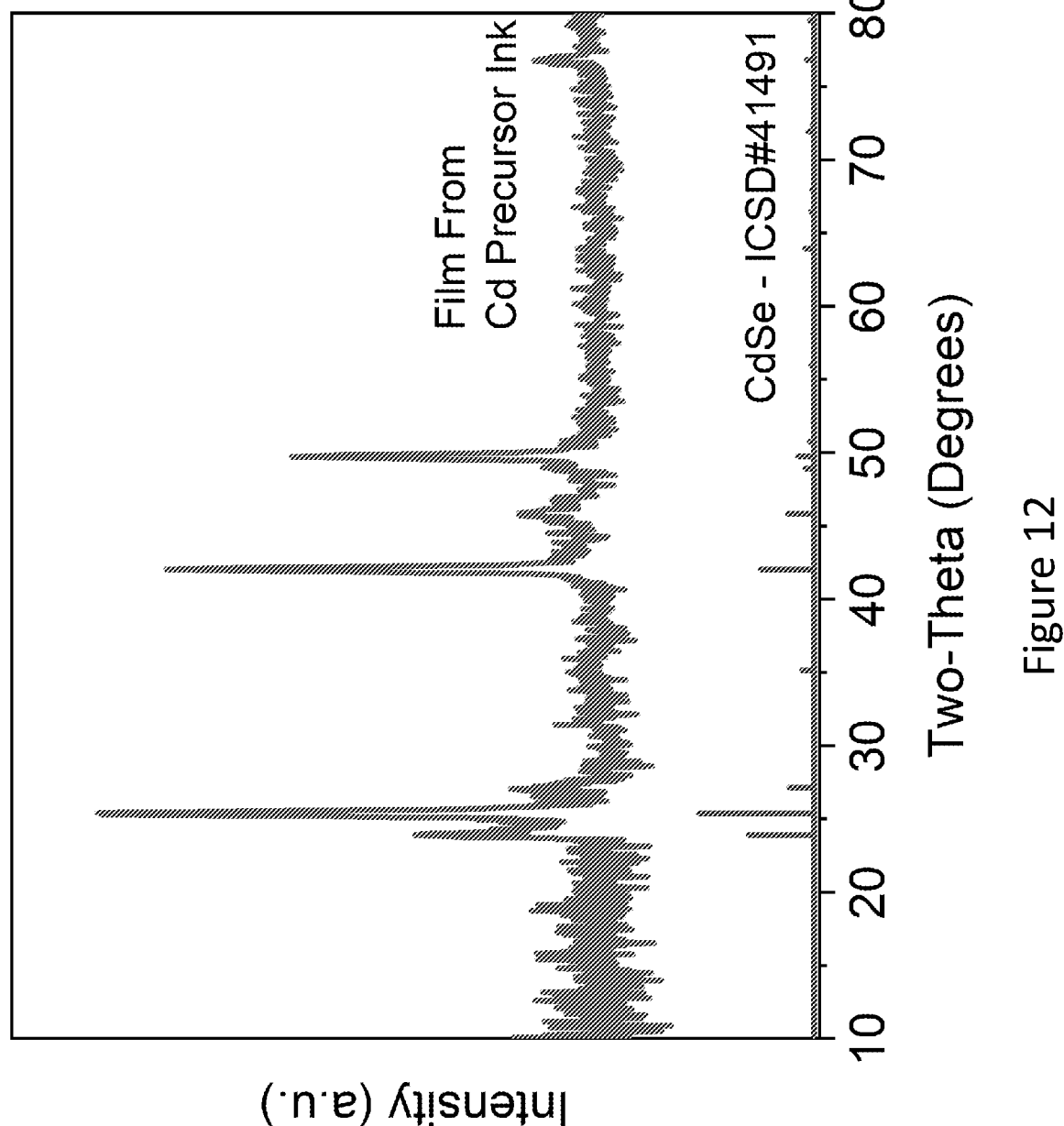
FIG. 12 shows the X-Ray Diffraction pattern for a CdSe film produced using an ink of cadmium dissolved in a solution of butylammonium polyselenide in butylamine.
Figure 13:
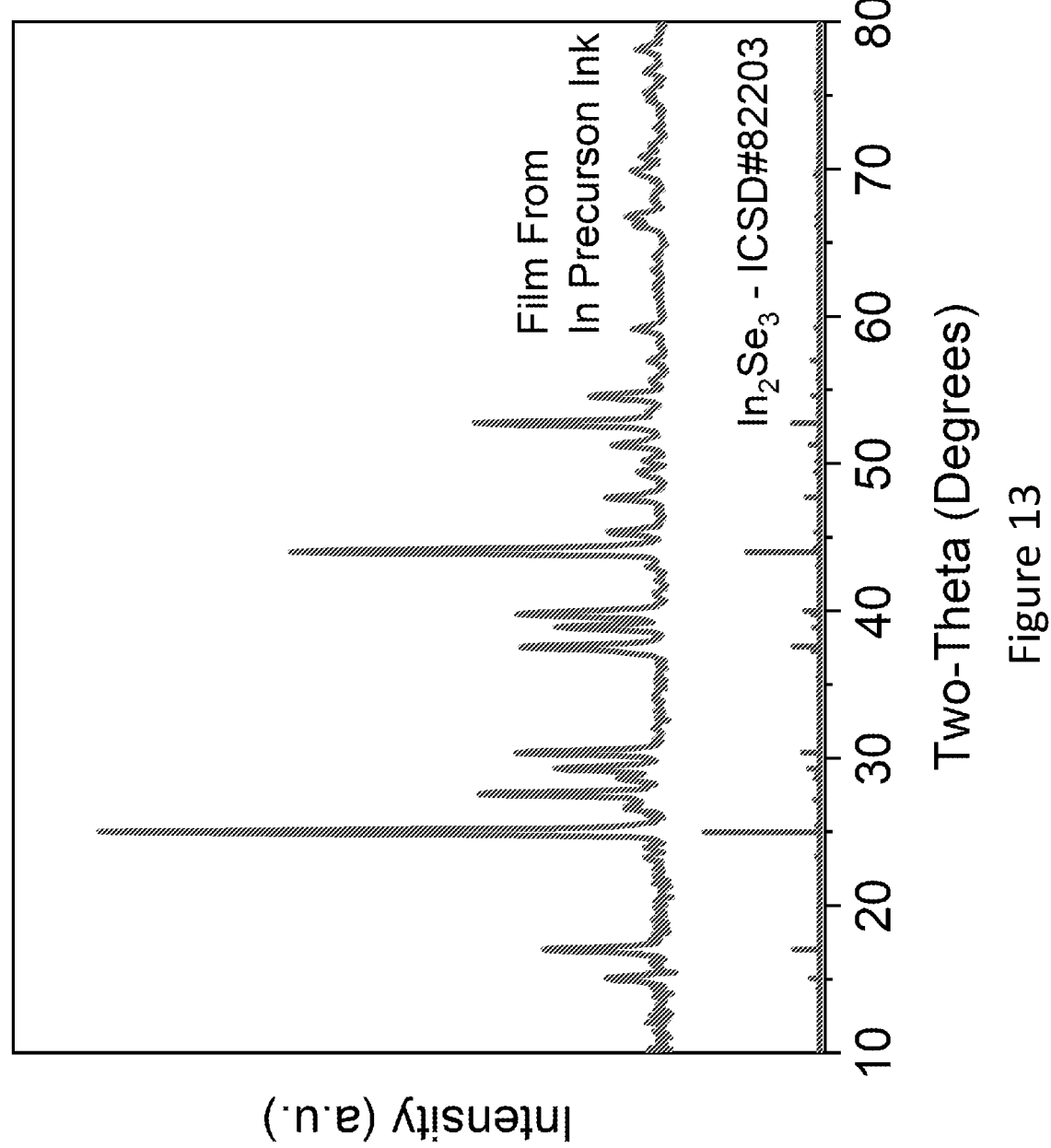
FIG. 13 shows the X-Ray Diffraction pattern for a $In_2Se_3$ film produced using an ink of indium dissolved in a solution of butylammonium polyselenide in butylamine.
Figure 14:
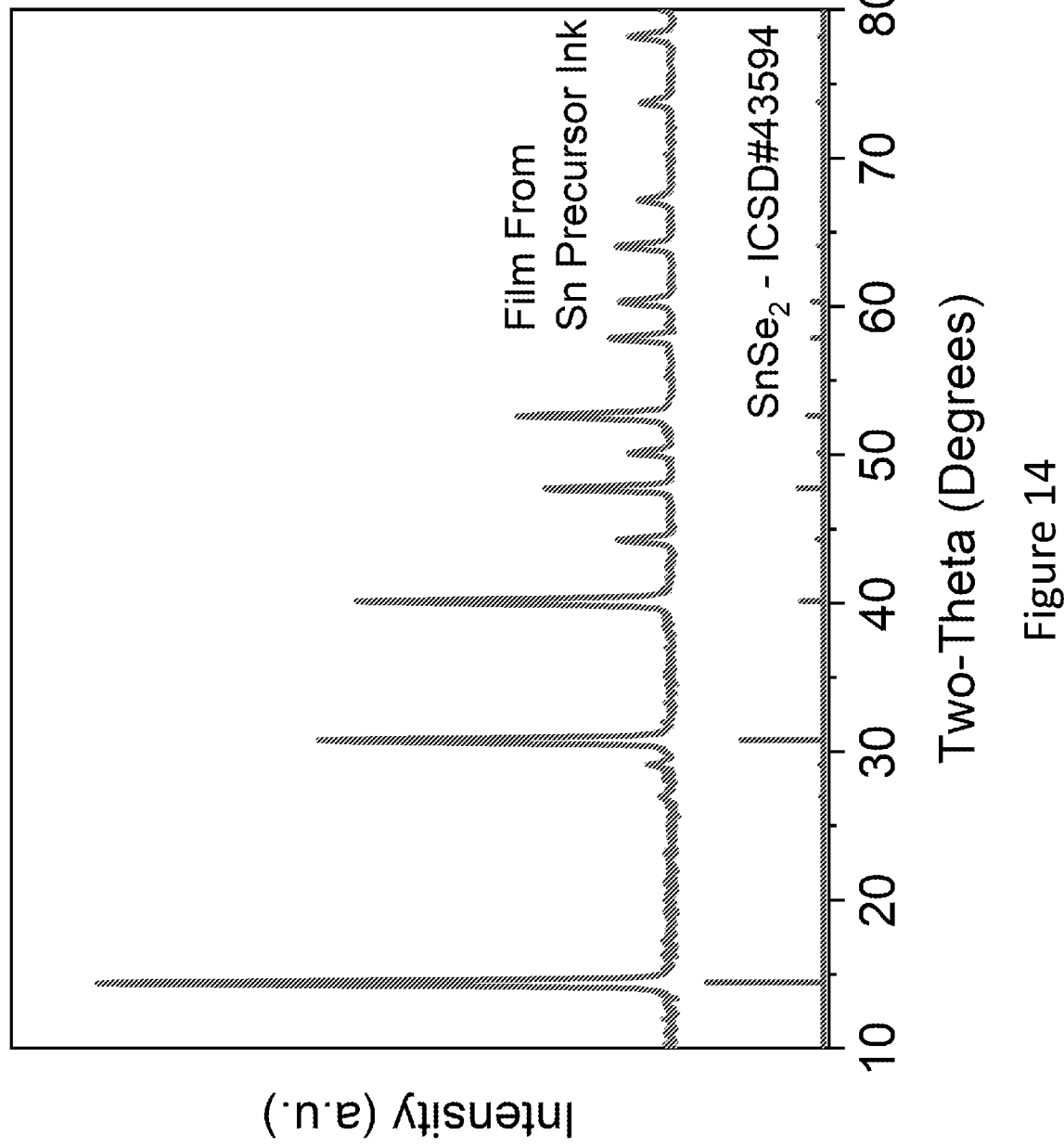
FIG. 14 shows the X-Ray Diffraction pattern for a $SnSe_2$ film produced using an ink of tin dissolved in a solution of butylammonium polyselenide in butylamine.

Similarly, FIGS. 6, 7, and 8 show spectra from Electrospray Ionization Mass Spectrometry operated in the negative mode for butylammonium polyselenide dissolutions of $Cu_2Se$, $Cu_2O$, and CuCl, respectively. Again, peaks correspond to ions containing only copper and selenium or only selenium, indicating the formation of copper polyselenide anions in solution for each precursor. It is noteworthy that no ions containing oxygen or chlorine are detected in the spectrum.

Another aspect of the current invention is that the dissolved metals and metal compounds in polyselenide containing solutions are used as precursor solutions to fabricate pure metal selenides. These pure metal selenides can be synthesized as nanoparticles or thin films. The metal selenides can be binary or multinary compounds. In yet another embodiment, the precursor polyselenide solution could be blended with other nonmetal elements or metal compounds to fabricate alloys containing selenium. For example, a controlled amount of sulfur or sulfur containing compound could be added to the polyselenide solution to fabricate sulfoselenides with desired ratio of sulfur and selenium. Similarly, a metal halide could be added to the precursor solution to fabricate compounds containing the halogen and selenium.

Figure 15:
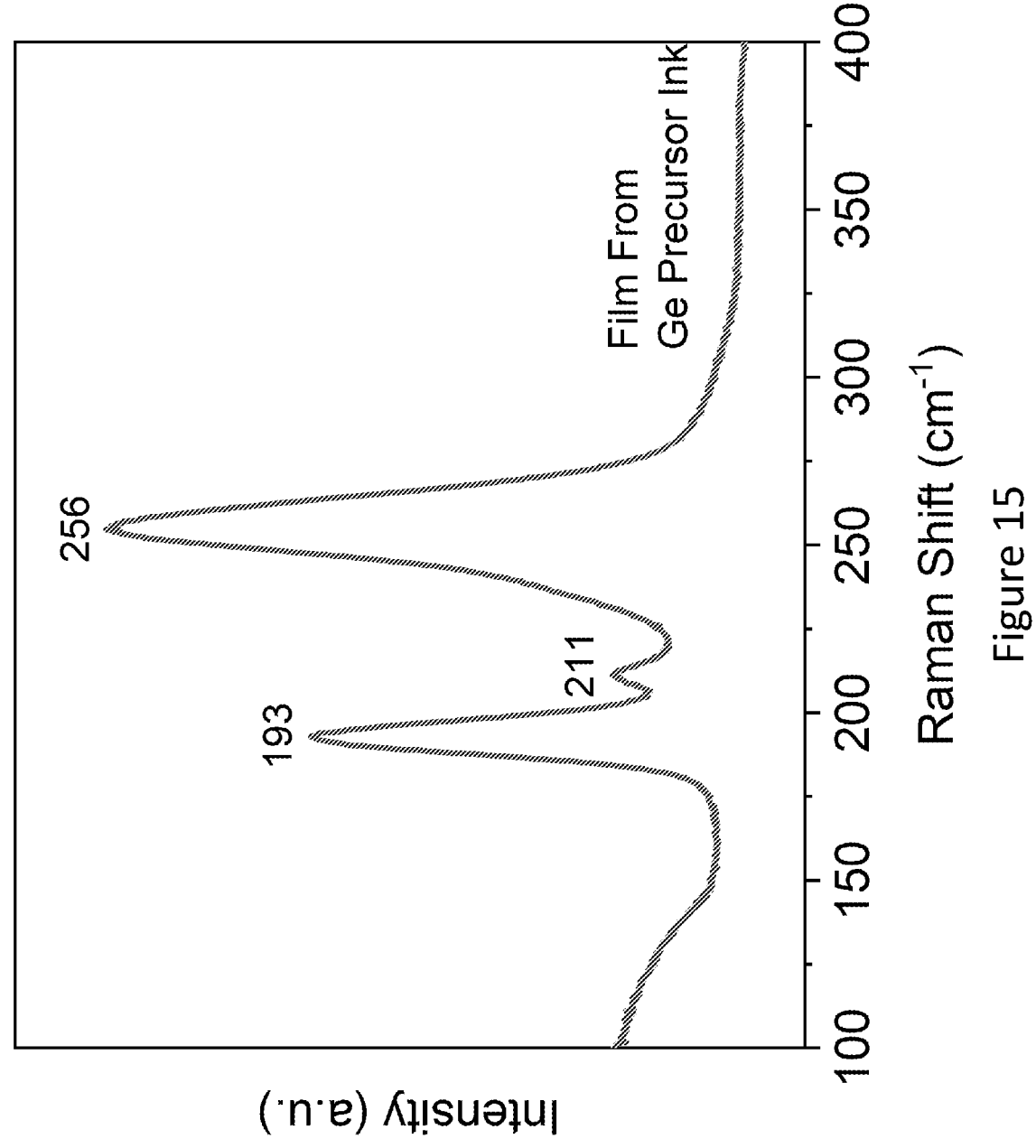
FIG. 15 shows the Raman spectrum for an amorphous germanium selenide film produced using an ink of germanium dissolved in a solution of butylammonium polyselenide in butylamine.
Figure 16:
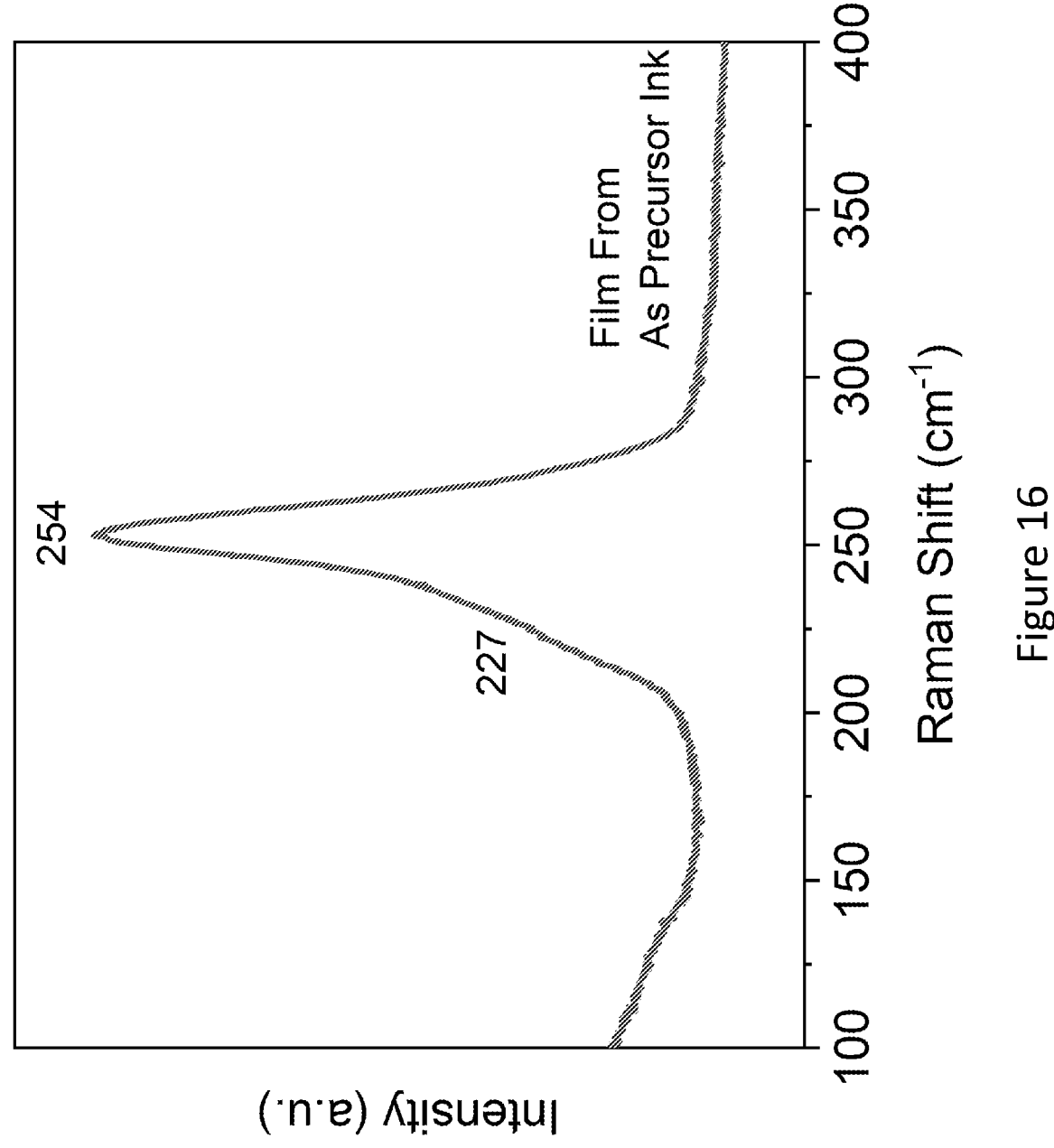
FIG. 16 shows the Raman spectrum for an amorphous arsenic selenide film produced using an ink of arsenic dissolved in a solution of butylammonium polyselenide in butylamine.

As examples of binary selenides that can be created using butylammonium polyselenide in butylamine was used to dissolve Ag, Cu, Zn, Cd, In, Sn, Ge, and As. A ratio of 10 selenium per metal was sufficient to fully dissolve the Cu, In, Sn, and As, while a ratio of 20 selenium per metal was sufficient to fully dissolve the Ag. For the other metals, excess solid was separated from the solution via centrifugation. The dissolved metal containing solutions provide the precursor solutions or the precursor inks for the fabrication of metal selenides. The crystalline metal selenides were obtained from the Ag, Cu, Zn, Cd, In, and Sn precursor inks after they were dropcast onto glass and annealed at 400° C. for 5 minutes in an inert atmosphere. The XRD pattern for these films are shown in FIG. 9, FIGS. 10, 11, 12, 13 and 14, respectively. For the germanium and arsenic precursor inks, amorphous, selenium-rich metal selenides were obtained after the films from the precursor inks were annealed for 5 minutes at 400° C. and 300° C., respectively under an inert atmosphere. As shown in FIG. 15 Raman spectrum of the germanium containing film, the amorphous germanium selenide can be identified by the peaks at 193 $cm^{-1}$, 211 $cm^{-1}$, and 256 $cm^{-1}$. As shown in FIG. 16 Raman spectrum of the arsenic containing thin film, the amorphous arsenic selenide can be identified by the peaks at 227 $cm^{-1}$ and 254 $cm^{-1}$.

The fabrication of metal selenides from dissolved metals and metal compounds in precursor solutions containing polyselenide ions need not be limited to binary materials. Through combinations of precursors (metals and metal containing compounds that are dissolved in the precursor solution), multinary metal selenides can also be produced.

Figure 17:
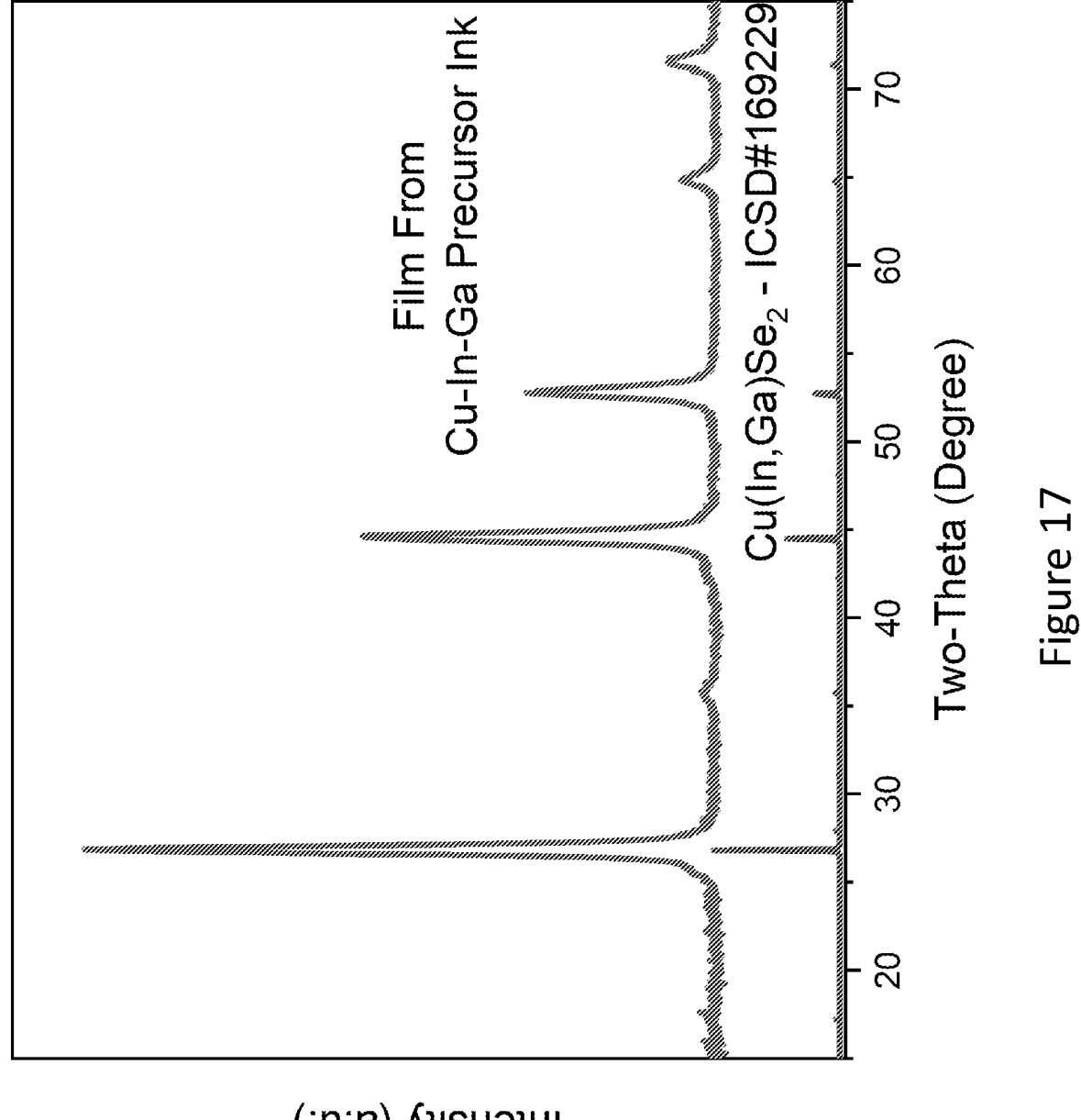
FIG. 17 shows the X-Ray Diffraction pattern for a Cu(In, Ga)$Se_2$ film produced using an ink of copper, indium, and gallium dissolved in a solution of butylammonium polyselenide in butylamine.

As an example of the synthesis of a multinary metal selenide, precursor inks containing copper, indium, and gallium dissolved with butylammonium polyselenide in butylamine were mixed. Gallium metal could be dissolved in the polyselenide containing solution when indium was also present. The combined precursor ink was dropcast onto glass and annealed at 400° C. for 5 minutes in an inert atmosphere. FIG. 17 shows the XRD pattern for the resulting film, confirming the formation of $Cu(In,Ga)Se_2$.

Figure 18:
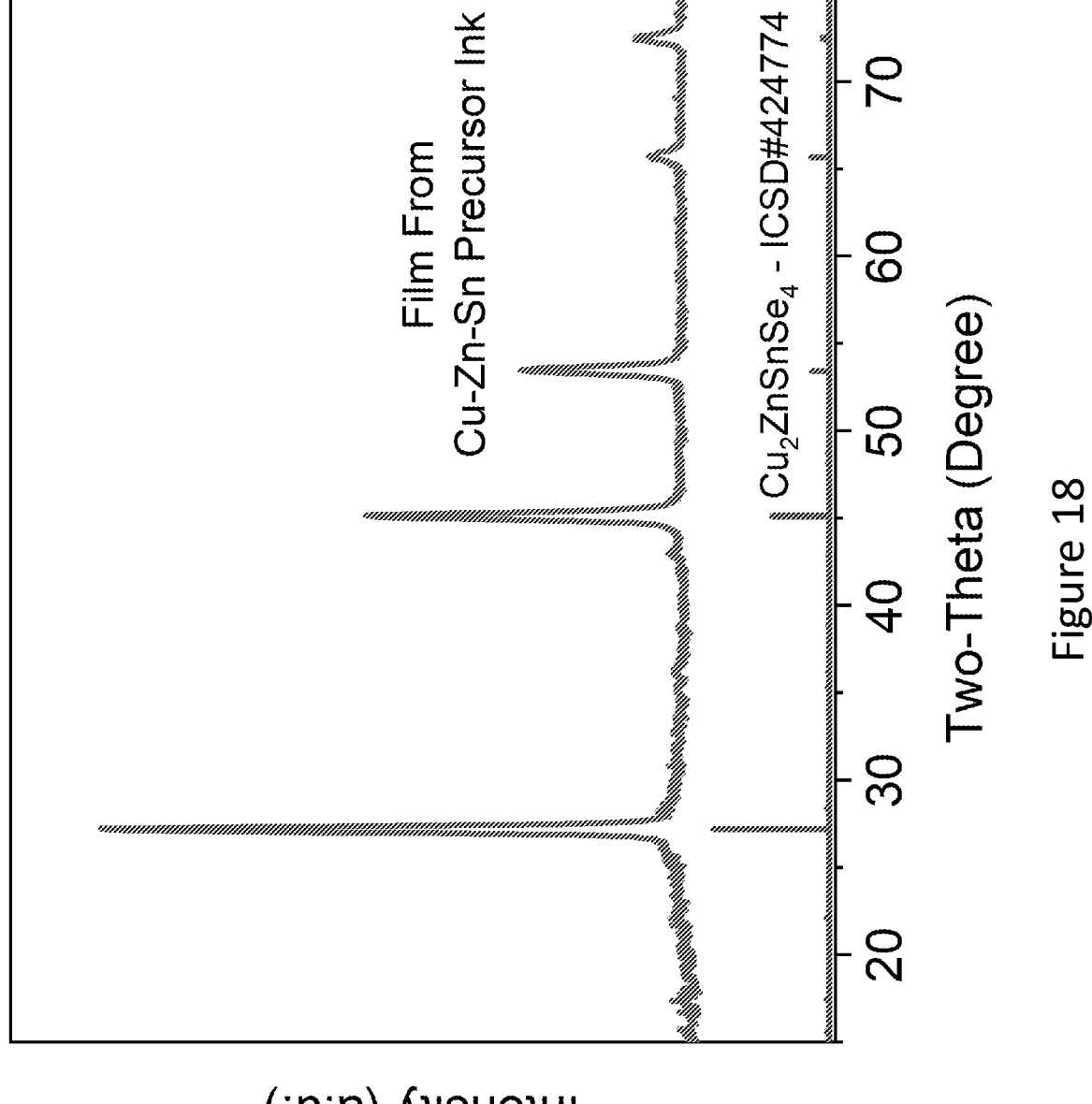
FIG. 18 shows the X-Ray Diffraction pattern for a $Cu_2ZnSnSe_4$ film produced using an ink of copper, zinc, and tin dissolved in a solution of butylammonium polyselenide in butylamine.

As another example of the synthesis of a multinary metal selenide, precursor inks containing copper, zinc, and tin dissolved with butylammonium polyselenide in butylamine were mixed. The combined precursor ink was dropcast onto glass and annealed at 400° C. for 5 minutes in an inert atmosphere. FIG. 18 shows the XRD pattern for the resulting film, confirming the formation of $Cu_2ZnSnSe_4$.

Additionally, the use of these metal and metal compounds dissolved in polyselenide containing precursor solutions for the fabrication of metal selenides need not be limited to solution processed films. Not only could these be used in alternative film fabrication techniques, but materials can also be synthesized in solution. Devices, substrates, and the like may be formed from the binary and/or multinary metal polyselenides.

Figure 19:
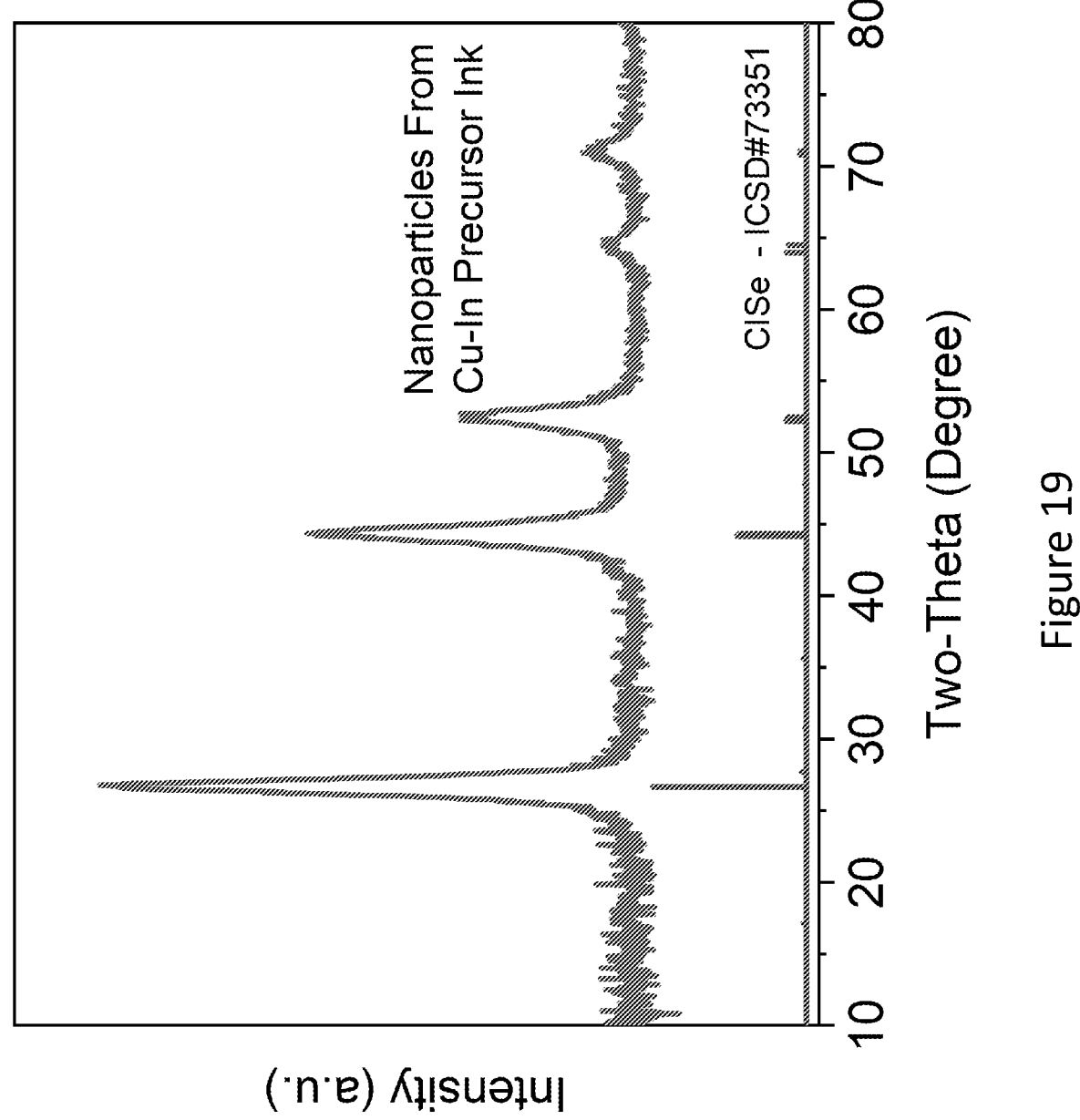
FIG. 19 shows the X-Ray Diffraction pattern for a $CuInSe_2$ nanoparticles produced using an ink of copper and indium dissolved in a solution of butylammonium polyselenide in butylamine then isolated and redissolved in oleylamine.
Figure 20:
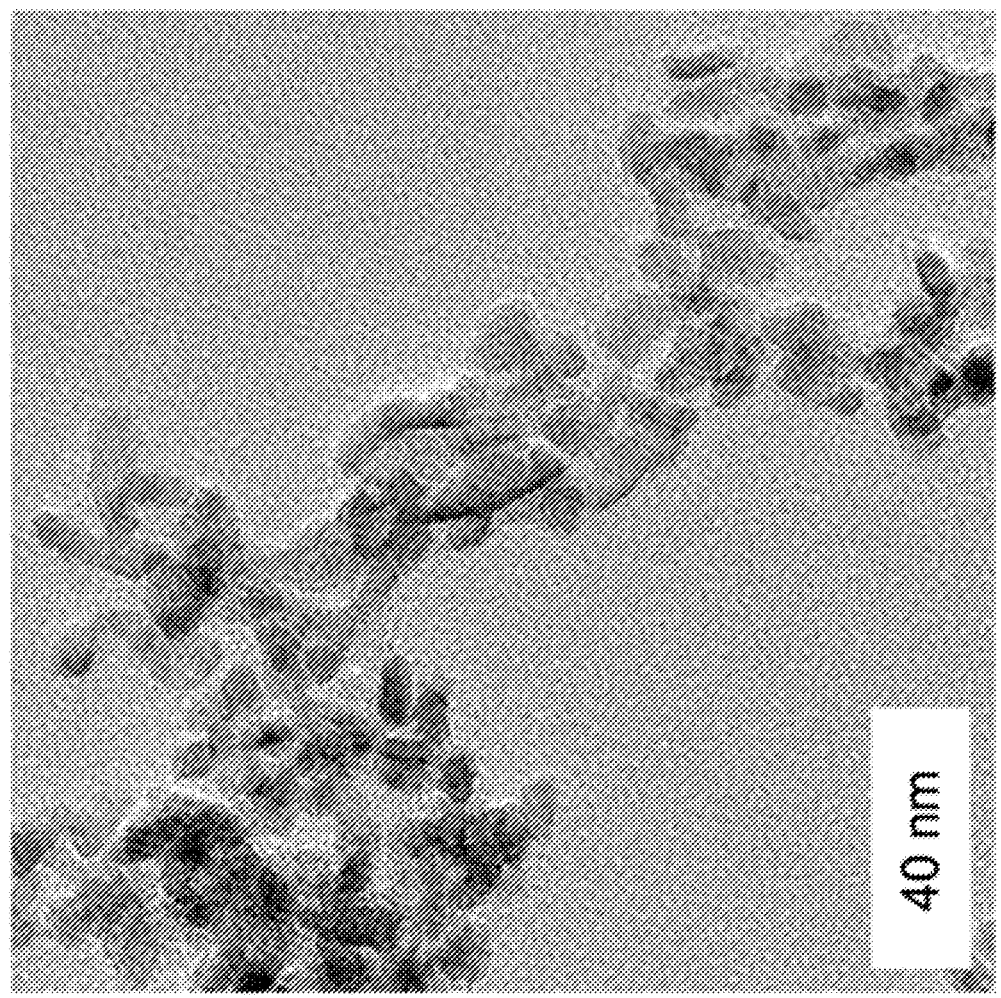
FIG. 20 shows a Transmission Electron Microscopy image of the $CuInSe_2$ nanoparticles produced using an ink of copper and indium dissolved in a solution of butylammonium polyselenide in butylamine then isolated and redissolved in oleylamine.

As an example of a nanomaterial formed in solution, copper and indium metals were dissolved in a solution of butylammonium polyselenide in butylamine. The soluble metal polyselenides were then precipitated with toluene and redissolved in oleylamine. The oleylamine solution was then heated to 225° C. for 30 minutes. Excess selenium was removed by dissolving in a mixture of oleylamine and ethanethiol. The nanoparticles were washed twice by precipitating with isopropanol, centrifuging, decanting the supernatant, and resuspending in hexanes. The XRD pattern for the resulting particles is shown in FIG. 19, confirming the formation of $CuInSe_2$. A transmission electron microscopy (TEM) image for the particles is shown in FIG. 20, confirming the formation of $CuInSe_2$ nanoparticles with diameters on the order of 10 nm.

While the present disclosure has been described with reference to certain embodiments, it will be apparent to those of ordinary skill in the art that nigh-infinite of other embodiments and implementations are possible that are within the scope of the present disclosure without departing from the spirit and scope of the present disclosure. It is therefore intended that the foregoing detailed description be regarded as illustrative rather than limiting.

The invention claimed is:

1. A method for preparing a selenium and metal containing precursor solution, comprising:
   a) preparing a solution containing polyselenide ions; and
   b) dissolving at least one metal source in the solution containing polyselenide ions, wherein the at least one metal source is selected from the group comprising elemental metals, metal containing compounds, and combinations thereof;
   wherein the selenium and metal containing solution is substantially sulfur free.

2. The method of claim 1 wherein step a) further comprises dissolving selenium in hydrazine to yield hydrazinium polyselenide.

3. The method of claim 1 wherein step a) further comprises:
   a1) dissolving selenium in a monoamine and a monothiol or a monoamine and a dithiol solution to form dissolved alkylammonium polyselenide,
   a2) separating alkylammonium polyselenide from the solution in step a1),
   a3) redissolving separated alkylammonium polyselenide in a suitable solvent.

4. The method in claim 3, where in step a2), alkylammonium polyselenide is separated by evaporating any sulfur containing species.

5. The method in claim 3, where in step a2), alkylammonium polyselenide is separated by adding to the solution from step a1) an antisolvent to precipitate alkylammonium polyselenide and separating precipitate from the solution remaining liquid.

6. The method of claim 5 wherein the antisolvent is nonpolar.

7. The method of claim 6, wherein antisolvent is selected from the group consisting of toluene, cyclohexane, and combinations thereof.

8. The method of claim 3 wherein in step a3), the suitable solvent is a polar solvent.

9. The method of claim 8, wherein the polar solvents is selected from the group consisting of an amine, diamine, N-methylformamide, dimethylformamide, dimethylsulfoxide, acetonitrile, an alcohol, pyridine and combinations thereof.

10. The method of claim 1 wherein the polyselenide ions are selected from the group consisting of having a ring structure, having a chain structure, and combinations thereof.

11. The method of claim 1 wherein the elemental metals is selected from the group consisting of Ag, Cu, Zn, Cd, In, Ga, Sn, Ge, As, and combinations thereof.

12. The method of claim 1 wherein the metal containing compounds is selected from the group consisting of a metal oxide, a metal halide, a metal nitrate, a sulfur free organometallic compound and combination thereof.

13. A method of fabricating a metal selenide, comprising:
   c) preparing a solution containing polyselenide ions;
   d) dissolving at least one metal source in the solution containing polyselenide ions to yield a precursor solution, wherein the at least one metal source is selected from the group comprising elemental metals, metal containing compounds, and combinations thereof and wherein the precursor solution is substantially sulfur free; and
   e) dropcasting the precursor solution onto glass and annealing the precursor solution.

14. The method according to claim 13, wherein the metal selenide is selected from the group consisting of a binary and a multinary selenide.

15. The method according to claim 14, wherein metal selenide is selected from the group consisting of copper selenide, silver selenide, arsenic selenide, zinc selenide, indium selenide, cadmium selenide, germanium selenide, tin selenide, $Cu(In,Ga)Se_2$, $Cu_2ZnSnSe_4$, $CuInSe_2$.

16. The process of claim 13 wherein the precursor ink solution is printed on a substrate and then annealed at a temperature higher than ambient temperature in an inert atmosphere to yield a metal selenide film.

17. The method of claim 13 wherein the fabricated metal selenide is particles.

18. The method of claim 17 wherein the particles are nanoparticles.

19. A method of direct deposition of multinary metal polyselenide films, consisting of:
   g) precipitating alkylammonium polyselenide with an antisolvent;
   h) redissolving precipitated alkylammonium polyselenide with a solvent to yield a solution containing polyselenide ions;
   i) dissolving at least one metal source in the solution containing polyselenide ions to yield a precursor solution, wherein the at least one metal source is selected from the group consisting of elemental metals and metal containing compounds; and
   j) fabricating metal polyselenides;
   wherein the at least one metal source is selected from the group consisting of Ag, Cu, Zn, Cd, In, Ga, Sn, Ge, As, Cu2Se, Cu2O, CuCl, and combinations thereof; and
   wherein the precursor solution is substantially sulfur-free.

* * * * *